United States Patent [19]

Choi

[11] Patent Number: 6,045,970
[45] Date of Patent: Apr. 4, 2000

[54] POLYMER FOR PHOTORESIST, PHOTORESIST COMPOSITION CONTAINING THE SAME, AND PREPARATION METHOD THEREOF

[75] Inventor: Sang-jun Choi, Seoul, Rep. of Korea

[73] Assignee: Samsung Electronics Co., Ltd., Suwon, Rep. of Korea

[21] Appl. No.: 09/218,027

[22] Filed: Dec. 22, 1998

[30] Foreign Application Priority Data

Apr. 20, 1998 [KR] Rep. of Korea ........................ 98-14070

[51] Int. Cl.⁷ ........................................................ G03F 7/004
[52] U.S. Cl. ...................... 430/270.1; 430/905; 430/910; 526/323.1
[58] Field of Search ................................ 430/270.1, 905, 430/910; 526/323.2

[56] References Cited

U.S. PATENT DOCUMENTS

| | | | |
|---|---|---|---|
| 4,491,628 | 1/1985 | Ito et al. ................................ | 430/270.1 |
| 5,324,804 | 6/1994 | Steinmann ................................ | 526/313 |
| 5,368,976 | 11/1994 | Tajima et al. ............................ | 430/176 |
| 5,733,704 | 3/1998 | Choi et al. ............................ | 430/270.1 |
| 5,738,975 | 4/1998 | Nakano et al. ....................... | 430/280.1 |
| 5,847,063 | 12/1998 | Choi et al. ............................ | 526/323.2 |

*Primary Examiner*—John S. Chu
*Attorney, Agent, or Firm*—Jones Volentine, LLP

[57] ABSTRACT

A polymer for use in making a chemically amplified photoresist, a photoresist composition containing the polymer, and a method of preparing the same. The polymer for a photoresist is formed by polymerizing three or more different monomers and it has an acid-labile di-alkylmalonate group bound to the backbone of the polymer. The polymer can be used to form a photoresist composition that includes the polymer and a photosensitive acid generator. The photoresist composition is suitable for forming a pattern having an excellent profile due to the high contrast and high thermal decomposition temperature of the photoresist composition.

18 Claims, No Drawings

POLYMER FOR PHOTORESIST, PHOTORESIST COMPOSITION CONTAINING THE SAME, AND PREPARATION METHOD THEREOF

BACKGROUND OF THE INVENTION

1. Field of the Invention

The present invention relates to a material for forming a semiconductor device, and more particularly, to a polymer for use in a chemically amplified photoresist used in photolithography, a photoresist composition containing the polymer, and to a method of preparing the polymer.

2. Description of the Related Art

Current semiconductor chips are highly integrated and require complicated manufacturing processes. For example, photolithography processes are needed that are capable of forming fine patterns in the range of 0.25 µm or less. Such fine patterns must be formed using deep ultraviolet (UV) rays of 248 nm, which have a shorter wavelength than conventional g-line (436 nm) and I-line (365 nm) rays. However, when deep-UV rays are used, a smaller number of protons are transferred when a dose of the same energy as a conventional light source is irradiated. Therefore, a dose of much greater energy is required when deep-UV rays are used in order to transfer the same number of protons and obtain the same result as is achieved using conventional photolithography. To overcome this problem, a new material referred to as a "chemically amplified photoresist" has been introduced, which is highly sensitive to protons, due to its improved photosensitivity even when deep-UV rays are irradiated at a similar dose to that used with conventional light source irradiation.

In general, the chemically amplified photoresist includes an acid-labile group which is easily subjected to hydrolysis by an acidic catalyst, and which functions as a dissolution inhibitor. The amplified photoresist also includes a photosensitive acid generator for generating protons $H^+$ (i.e., acid) by exposure to light. When the chemically amplified photoresist is exposed to light, acid is generated by the photosensitive acid generator. The dissolution inhibitor which is bound to the backbone of the polymer, is then hydrolyzed by the catalytic reaction of the generated acid, thereby changing the polarity (e.g., solubility) of the polymer. Acid hydrolysis of the polymer by the diffusion of acid produces a pattern having a higher transparency.

Thus, contrast, (i.e., an index representing the difference in solubility of a chemically amplified photoresist before and after the exposure to light) is determined by the acid-labile group bound to the backbone of the polymer.

U.S. Pat. No. 4,491,628 discloses a chemically amplified photoresist containing a polymer and using t-butoxycarbonyl (t-BOC) as an acid-labile group. However, this chemically amplified photoresist has a thermal decomposition temperature (Td) that is lower than its glass transition temperature (Tg). Thus, if the photoresist is baked to a temperature that is above the glass transition temperature before exposure to light in order to vaporize unwanted organic solvent and make the photoresist film hard, the photoresist decomposes. On the other hand, if the pre-baking temperature is low enough to prevent thermal decomposition, airborne contaminants can be absorbed into the surface of the exposed photoresist film, thereby preventing a catalytic reaction by the acid. This results in a pattern having an inferior profile, such as T-top profile. T-top profiles are the result of airborne contaminants absorbed into the photoresist film surface which neutralize the acid that is generated by the photoresist upon exposure to light. As a result, some portions of the exposed photoresist do not undergo acid hydrolysis and thus remain insoluble. The insoluble portions of the photoresist are not developed by the developer and result in T-top profiles.

SUMMARY OF THE INVENTION

To solve the above problems, it is an objective of the present invention to provide a polymer for a chemically amplified photoresist having a larger contrast and excellent thermal characteristics.

It is another objective of the present invention to provide a photoresist composition having excellent thermal characteristics and which is suitable for forming a higher resolution pattern that has a higher contrast. It is still another objective of the present invention to provide a method of preparing the photoresist composition.

To achieve the first objective, there is provided a polymer for use in a chemically amplified photoresist which polymer is polymerized with three different monomers or more. Further, the polymer has an acid-labile di-alkylmalonate bound to its backbone. Preferably, the di-alkylmalonate group is either di-t-butylmalonate or di-tetrahydropyranylmalonate.

A photoresist composition of the present invention includes the polymer and a photosensitive acid generator in an amount of from about 1 to 15 weight percent based on the weight of the polymer. Preferably, the photoresist composition further includes an organic base, e.g., amine derivatives in an amount of from about 0.01 to 2.0 weight percent based on the weight of the polymer mixture.

The polymer is obtained by polymerizing (1) di-alkylmalonylmethylstyrene, alkoxystyrene or alkoxystyrene derivative, and acetoxystyrene or acetoxystyrene derivative, or (2) di-alkylmalonylmethylstyrene, (meth) acrylate derivative and acetoxystyrene or acetoxystyrene derivative to obtain a terpolymer having three or more different monomers, and then deacetylating the polymerized product.

The polymer for a chemically amplified photoresist according to the present invention has a di-alkylmalonate group as a dissolution inhibitor, which is very bulky before exposure to light. However, exposure causes the photosensitive acid generator to form acid which hydrolyzes the di-alkylmalonate group in the dissolution inhibitor thereby producing malonic acid and making the dissolution inhibitor less bulky. Acid hydrolysis significantly increases the solubility of the photoresist, and this results in contrast that is significantly better than that obtained using conventional photoresist compositions. Importantly, the thermal decomposition temperature Td of the photoresist compositions of the present invention is higher than the glass transition temperature Tg, so the photoresist film can be hardened by pre-baking before exposure using a pre-bake temperature that is higher than the glass transition temperature. The high temperature pre-bake prevents a defective pattern profile, such as a T-top, to be formed due to damage by contaminants.

The polymer mixture for a chemically amplified photoresist according to the present invention has an acid-labile di-alkylmalonate group attached to the polymer backbone where it functions as a dissolution inhibitor.

DESCRIPTION OF THE PREFERRED EMBODIMENTS

A polymer mixture for a chemically amplified photoresist and a photoresist composition containing the polymer mixture, will be hereinafter described in detail. A method of preparing the photoresist composition and a photolithography process using the photoresist composition will also be described.

Polymer for Chemically Amplified Photoresist

A polymer for a chemically amplified photoresist according to the present invention is a polymer containing an acid-labile di-alkylmalonate group bound to a polymer backbone composed of three or more different monomers. In a preferred embodiment, the di-alkylmalonate group is di-t-butylmalonate or di-tetrahydropyranyl malonate.

The polymer for use in making a chemically amplified photoresist according to a preferred embodiment of the present invention is represented by the following chemical formula (CF1), which is a terpolymer formed of monomers such as di-alkylmalonylmethylstyrene, alkoxystyrene or alkoxystyrene derivative, and hydroxystyrene or hydroxystyrene derivative. A terpolymer is a polymer that is formed of three different monomers.

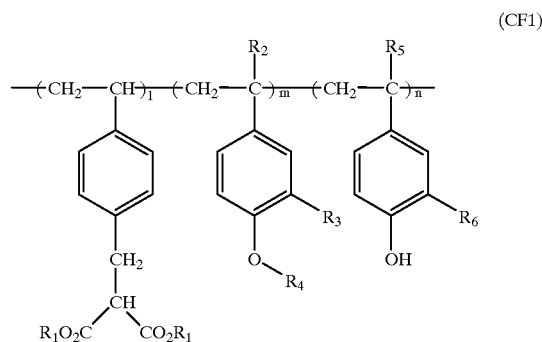

(CF1)

In chemical formula (CF1), R1 is t-butyl or tetrahydropyranyl; R4 is methyl or t-butyl; R2, R3, R5 and R6 are hydrogen or methyl, and l, m and n are integers such that the ratio of $l/(l+m+n)$ is from about 0.01–0.5, the ratio of $m/(l+m+n)$ is from about 0.01–0.5, and the ratio of $l+m/(l+m+n)$ is from about 0.1–0.5. In a preferred embodiment, both R1 and R4 are t-butyl groups, and R2, R3, R5 and R6 are hydrogen.

Another terpolymer, represented by the following chemical formula (CF2), is formed of monomers such as di-alkylmalonylmethylstyrene, (meth)acrylate derivative, acetoxystyrene or acetoxystyrene derivative, and hydroxystyrene or hydroxystyrene derivative.

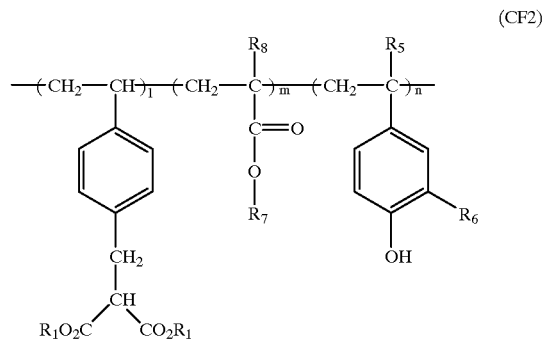

(CF2)

In chemical formula (CF2), R1 and R7 are t-butyl or tetrahydropyranyl; R5, R6 and R8 are hydrogen or methyl; and l, m and n are integers such that the ratio of $l/(l+m+n)$ is from about 0.01–0.5, the ratio of $m/(l+m+n)$ is from about 0.01–0.5, and the ratio of $l+m/(l+m+n)$ is from about 0.1–0.5. In another preferred embodiment, the terpolymer, both R1 and R7 are t-butyl groups, and R5, R6 and R8 are hydrogen. In still another preferred embodiment, the weight average molecular weight Mw of the polymer represented by the chemical formula (CF1) and/or (CF2) is in the range of from about 5,000 to 100,000.

Photoresist Composition

A photoresist composition according to the present invention includes one of the above-described polymers of chemical formulae (CF1) or (CF2), and a photosensitive acid generator in an amount of from about 1 to 15 weight percent based on the weight of the polymer. In a preferred embodiment, compounds having a high thermal stability such as triarylsulfonium salts, diaryliodonium salts or sulfonates are used as the photosensitive acid generator.

A photoresist composition according to the present invention further contains an organic base in an amount of from about 0.01 to 2.0 weight percent based on the weight of the polymer. Some examples of a suitable organic base for use in the present invention are triethylamine, triisobutylamine, diethanolamine and triethanolamine. The organic base prevents a decrease in a critical size of the pattern after exposure, caused by acid diffusing from an exposed portion of the photoresist to a unexposed portion.

The photoresist compositions of the present invention have a dissolution inhibitor that includes a polymer that has a di-alkylmalonate as an acid-labile group bound its backbone. Di-alkylmalonate is hydrolyzed into malonic acid by the acid generated by the photosensitive acid generator through exposure to light. The acid hydrolysis significantly increases the solubility (i.e., contrast) of the photoresist composition after exposure by decreasing the size of the dissolution inhibitor. Also, because the di-alkylmalonate group and the photosensitive acid generator are both thermally stable, the photoresist compositions of the present invention have the important advantage of being thermally stable at temperatures that are higher than their glass transition temperature of approximately 130° C. This means that a wafer coated with such a photoresist composition can be pre-baked at a temperature that is higher than its glass transition temperature Tg, but lower than its decomposition temperature Td. The pre-bake prevents contaminants from being absorbed into the photoresist where they interfere with the function of the photosensitive acid generator, without causing the photoresist to decompose.

Preparation Method of Polymer for Photoresist

1. Preparation Method of Terpolymer Expressed by Chemical Formula (1)

1-1. Preparation of Monomer: di-alkylmalonylmethylstyrene (compound II)

As shown in the following reaction formula (RF1), after dissolving di-alkylmalonate (I) in an organic solvent such as tetrahydrofuran (THF) in which sodium hydride has been dissolved, chloromethylstyrene is added to the solution. Di-alkylmalonylstyrene (II) is obtained through a substitution reaction.

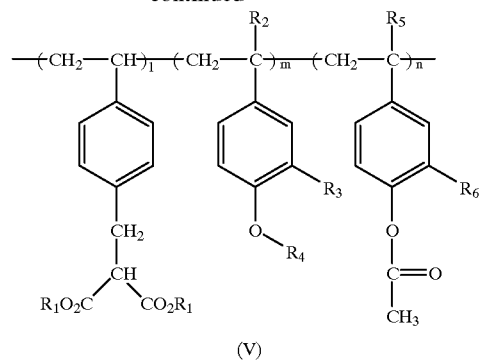

(RF 1)

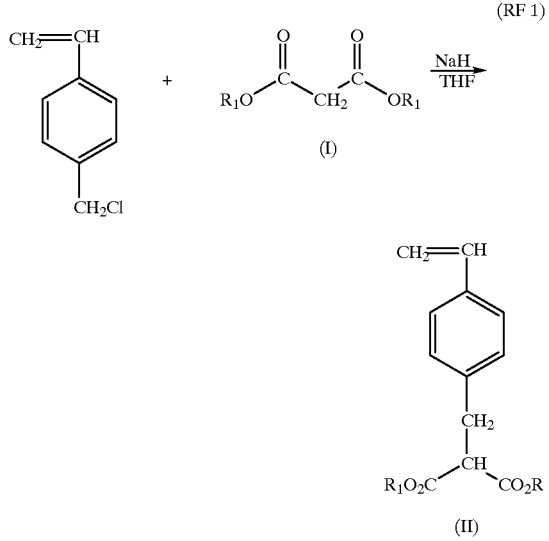

In reaction formula (RF1), R1 is t-butyl or tetrahydropyranyl.

1-2. Preparation of terpolymer (V) by polymerization with di-alkylmalonylmethylstyrene (II), alkoxystyrene or alkoxystyrene derivative (III) and acetoxystyrene or acetoxystyrene derivative (IV) monomers Terpolymer (V) is obtained through the reactions represented by the following reaction formula (RF2).

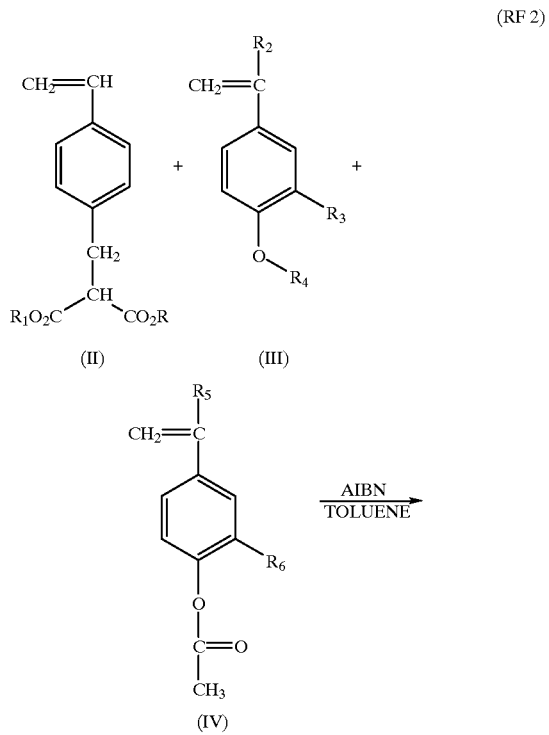

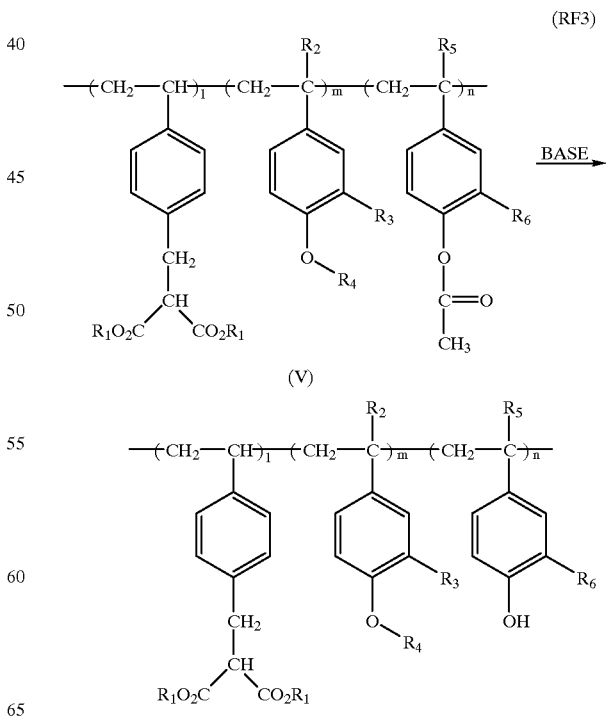

In reaction formula (RF2), R1 and R4 are t-butyl or tetrahydropyranyl; R2 is methyl or t-butyl; R3, R5 and R6 are hydrogen or methyl; and l, m and n are integers such that the ratio of l (l+m+n) is from about 0.01–0.5, the ratio of m/(l+m+n) is from about 0.01–0.5, and the ratio of l+m/(l+m+n) is from about 0.1–0.5.

After dissolving di-alkylmalonylmethylstyrene (II), alkoxystyrene or alkoxystyrene derivative (III) and acetoxystyrene or acetoxystyrene derivative (IV) in an organic solvent, e.g., toluene, a polymerization initiator, such as azobisisobutyronitrile (AIBN) is added to obtain terpolymer (V) through polymerization.

1-3. Deacetylation of terpolymer (V) to form terpolymer (VI)

As shown in the following reaction formula (RF3), terpolymer (V) is deacetylated using an organic base, resulting in terpolymer (VI) having a weight average molecular weight ranging from 5,000 to 100,000 that is represented by the chemical formula (1). In this reaction, the base is ammonium hydroxide or hydrazine, however other organic bases known to those skilled in the art may be used instead.

2. Preparation Method of Terpolymer (VIII) Represented by Chemical Formula (2)

2.1 Preparation of terpolymer (VIII) by polymerization with di-alkylmalonylmethylstyrene (II), acetoxystyrene or acetoxystyrene derivative (IV), and (meth)acrylate derivative (VII) monomers Terpolymer (VIII) is obtained through the reactions represented by the following reaction formula (RF4).

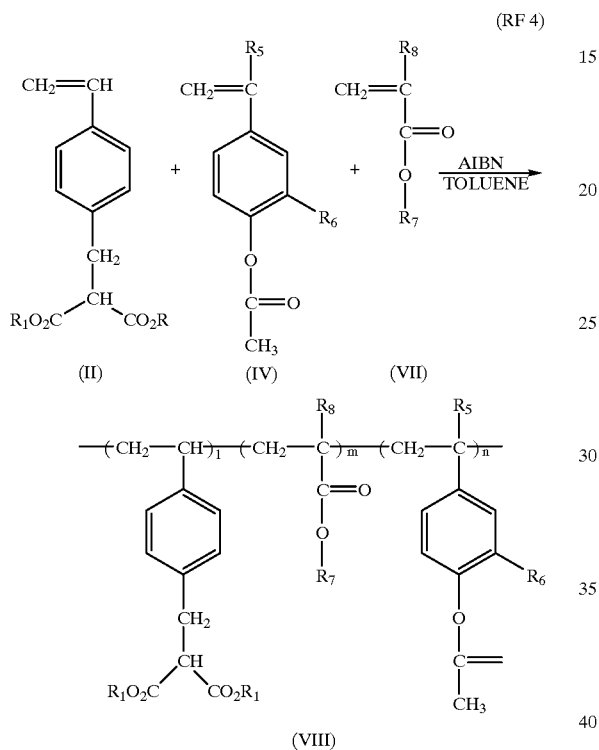

In reaction formula (RF4), R1 and R7 are t-butyl or tetrahydropyranyl; R5, R6 and R8 are hydrogen or methyl; and l, m and n are integers such that the ratio of l (l+m+n) is from about 0.01–0.5, the ratio of m/(l+m+n) is from about 0.01–0.5, and the ratio of l+m/(l+m+n) is from about 0.1–0.5.

After dissolving di-alkylmalonylmethylstyrene (II), acetoxystyrene or acetoxystyrene derivative (IV), and (meth)acrylate derivative (VII) in an organic solvent, a polymerization initiator such as AIBN is added to obtain terpolymer (VIII) through polymerization.

2-2. Deacetylation of terpolymer (VIII) to form terpolymer (IX)

As shown in the following reaction formula (RF5), terpolymer (VIII) is deacetylated using an organic base, resulting in terpolymer (IX) having weight average molecular weight of 5,000–100,000 and represented by the chemical formula (CF2).

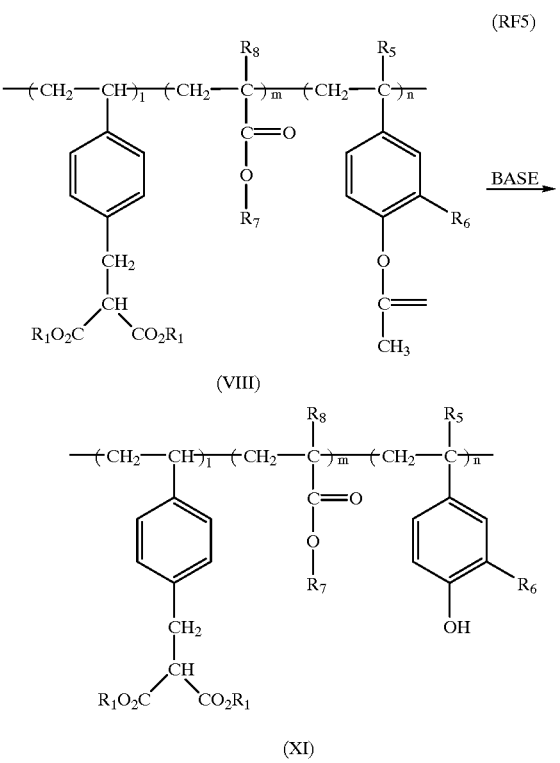

Preparation Method of Photoresist Composition, and Photolithography Method using the Composition Terpolymers (VI) and (IX) obtained by the above-described reaction methods and represented by chemical formulas (CF1) and (CF2), respectively, and a photosensitive acid generator ranging from about 1 to 15 weight percent based on the weight of the terpolymer, are dissolved in an appropriate solvent to form a chemically amplified photoresist composition. Preferred photosensitive acid generators include triarylsulfonium salts, diaryliodonium salts or sulfonates that are thermally stable.

Preferably, the photoresist compositions of the present invention further include an organic base in an amount of from about 0.01 to 2.0 weight percent based on the weight of the terpolymer. Preferred organic bases include triethylamine, triisobutylamine, diethanolamine or triethanolamine.

Chemically amplified photoresist compositions prepared by the above method may be applied to a general photolithography process. Particularly, the chemically amplified photoresist compositions of the present invention are suitable for forming a fine pattern having a design rule of 0.25 $\mu$m or less, using deep ultraviolet rays as a light source for exposure.

The acid-labile di-alkylmalonate-containing dissolution inhibitor and the photosensitive acid generator used in the photoresist compositions of the present invention are both thermally stable. Therefore the photoresist compositions containing these compounds have a high thermal decomposition temperature Td of approximately 170° C. or more, which is higher than their glass transition temperature Tg of approximately 130° C. Having a Td that is higher that the Tg makes it is possible to pre-bake the photoresist at a high temperature before exposure to light in order to harden it without causing the photoresist to decompose. Thus, damage of the photoresist film by airborne contaminants can be effectively prevented when the photoresist compositions of the present invention are used.

After pre-baking, the photoresist film is exposed to a deep ultraviolet ray light source using a mask having a predetermined pattern. Acid is generated by the photosensitive acid generator in the photoresist film upon exposure, and the di-alkylmalonate group bound to the polymer is converted into malonic acid by acid hydrolysis due to the catalytic reaction of the generated acid. The acid hydrolysis causes a significant difference in the polarity of the exposed portion of the photoresist film and the polarity of the unexposed portion thereby creating a high contrast After the exposure, the photoresist film undergoes a short post-exposure thermal treatment before development. The post-bake activates the acid hydrolysis thereby completely converting any di-alkylmalonate remaining in the exposed portion into malonic acid, and increasing the contrast.

Next, the photoresist is developed using an appropriate developer which is selected depending on whether the photoresist film is a positive or a negative photoresist. Thereafter, the standard processes are executed to complete the photoresist pattern formation. A high resolution photoresist pattern having a good profile is formed using the photoresist compositions of the present invention.

Hereinafter, the polymer mixture, the photoresist composition containing the polymer mixture, and photolithography using the photoresist compositions of the present invention will be described through the following nonlimiting examples.

EXAMPLE 1

Preparation of di-t-butylmalonylmethylstyrene (BMST) Monomer 4.8 g (0.12 mol) of sodium hydride was poured into 250 ml of tetrahydrofuran (THF). 25 g (0.11 mol) of di-t-butylmalonate was slowly dropped into the solution and reacted for about 1 hour. Then, 0.1 mol of chloromethylstyrene was slowly dropped into the mixture at 0° C., and reacted for 12 hours at room temperature. After the substitution reaction was completed, the reaction product was dissolved in excessive water, neutralized with hydrochloric acid, and then extracted using diethyl ether.

After drying the obtained reactant using magnesium sulfate, the reaction product was separated using column chromatography (yield 65%).

Nuclear Magnetic Resonance (NMR) and Fourier Transform Infrared (FT-IR) spectroscopy analyses were performed on the obtained DBMST monomer and the results are as follows.

$^1$H-NMR (CDCl$_3$)(ppm): 1.4(s,18H), 3.1(d, 2H), 3.5(t, 1H), 5.2(dd, 1H), 5.7(dd, 1H), 6.6(dd, 1H), 7.2(m,4H); FT-IR(NaCl)(cm$^{-1}$): 2978(C-H, t-butyl), 1727(C=O), 1369, 1140, 847.

EXAMPLE 2

Preparation of terpolymer (DBMST-t-butoxystyrene (BST)-acetoxystyrene (AST))

3 g (9 mmol) of DBMST, 3.2 g (18 mmol) of t-butoxystyrene (BST) and 10.5 g (63 mmol) of acetoxystyrene (AST) were dissolved in 80 ml of toluene. Then, 0.74 g of AIBN was added, and purged using nitrogen gas for 1 hour, and polymerization was performed for about 24 hours at 70° C.

After the polymerization, the reaction product was precipitated in excessive methanol (about 10 times methanol to one part reaction solution). Then the precipitate was dried in a vacuum oven maintained at 50° C. for about 24 hours to separate the reaction product (yield 70%).

The obtained reaction product was a terpolymer containing DBMST, BST and AST monomers, having a weight average molecular weight of 13,125 and a polydispersity of 1.7. The result of FT-IR analysis of the terpolymer (DBMST-BST-AST) is as follows.

FT-IR(KBr)(cm$^{-1}$): 2978 (C-H, t-butyl), 1767 (C=O, acetyl), 1727 (C=O, malonyl), 1368, 1214.

EXAMPLE 3

Preparation of deacetylated terpolymer (DBMST-BST-hydroxystyrene (HST))

10 g of the terpolymer obtained by Example 2 was refluxed in a mixed solution containing 10 ml of ammonium hydroxide (28%) and 50 ml of methanol for about 4 hours, for deacetylation. Then, the reaction product was slowly precipitated in excessive water.

After dissolving the precipitant in THF, it was reprecipitated in it was precipitated slowly in excess n-hexane. Then, the precipitant was dried in a vacuum oven maintained at 50° C. for about 24 hours to separate the reaction product (yield 91%).

The obtained reaction product was a terpolymer containing DBMST, BST and Hydroxystyrene (HST) monomers present at a ratio of about 10:20:70. The weight average molecular weight of the terpolymer was 12,639, the polydispersity was 1.85, and transmittance against an ultraviolet ray was 73%/μm. The result of FT-IR analysis of the terpolymer (DBMST-BST-HST) is as follows.

FT-IR(KBr)(cm$^{-1}$): 3440 (O-H), 2978 (C-H, t-butyl), 1728 (C=O), 1513, 1368, 1141.

In additional experiments, terpolymers having different polymerizing ratios of each monomer were also obtained using the same conditions described above. To analyze these terpolymers, the weight average molecular weight (Mw), polydispersity, and transmittance against the ultraviolet rays (%/μm) of each terpolymer were measured. Triphenylsulfonium triflate (PSOTf) was added in an amount of 3.0 weight percent based on the weight of the terpolymer as a photosensitive acid generator to form a photoresist composition. The optimum exposure energy of the photoresist composition required to form a pattern with 0.40 μm line and space arrays was measured. The results are tabulated in Table 1.

TABLE 1

Optimum Exposure Energy of the Photoresist Composition

| Terpolymer | DBMST:BST:HST | Weight Average Molecular Weight | Poly-dispersity | Trans-mittance (%/μm) | Optimum Exposure Energy (mJ/cm$^2$) |
|---|---|---|---|---|---|
| 1 | 22:10:68 | 10954 | 1.81 | 72 | 45 |
| 2 | 20:10:70 | 11675 | 1.84 | 70 | 34 |
| 3 | 10:25:65 | 11927 | 1.81 | 74 | 25 |
| 4 | 10:20:70 | 12639 | 1.85 | 73 | 21 |
| 5 | 5:25:70 | 10438 | 1.89 | 74 | 30 |

EXAMPLE 4

Preparation of terpolymer (DBMST-t-butylacrylate (BA)-AST)

6.8 g (20 mmol) of DBMST, 7.8 g (60 mmol) of t-butylacrylate (BA) and 20 g (120 mmol) of (AST) acetoxystyrene were dissolved in 140 ml of toluene. Then, the reaction product was separated through the same processes as in Example 2, except that 1.31 g of AIBN was added to initiate polymerization.

The obtained reaction product was a terpolymer containing DBMST, BA and AST monomers, having a weight average molecular weight of 13,117 and polydispersity of 1.98. The result of FT-IR analysis of the terpolymer (DBMST-BA-AST) is as follows.

FT-IR(KBr)(cm$^{-1}$): 2978 (C-H, t-butyl), 1766 (C=O, acetyl), 1724 (C=O), 1506, 1369 (C-H, t-butyl), 1217 (C-O), 1167, 1147, 912.

EXAMPLE 5

Preparation of deacetylated terpolymer (DBMST-BA-HST)

10 g of terpolymer obtained by Example 4 was deacetylated by the same method as in Example 3. The obtained reaction product was a terpolymer containing DBMST, BA and HST monomers at a ratio of 10:30:60. The weight average molecular weight of the obtained terpolymer was 12,438, the polydispersity was 1.97, and transmittance against an ultraviolet ray was 74%/μm. The result of FT-IR analysis of the DBMST-BA-HST terpolymer is as follows.

FT-IR(KBr)(cm$^{-1}$): 3397 (O-H), 2978 (C-H, t-butyl), 1699 (C=O), 1513, 1369 (C-H, t-butyl), 1231 (C-O), 1172, 1150, 830.

Terpolymers having different polymerizing ratios of each monomer were obtained under the same conditions as the above. Then, the weight average molecular weight (Mw), polydispersity, and transmittance against the ultraviolet rays (%/μm) of each terpolymer were measured. TPSOTf in an amount of 3.0 weight percent based on the weight of the terpolymer was added as a photosensitive acid generator to form a photoresist composition. The optimum exposure energy of the photoresist composition, required for forming a pattern with 0.40 μm line and space arrays, was then measured. The results are tabulated in Table 2.

TABLE 2

Optimum Exposure Energy of the Photoresist Composition

| Terpolymer | DBMST: BA:HST | Weight Average Molecular Weight | Poly- dispersity | Trans- mittance (%/μm) | Optimum Exposure Energy (mJ/cm$^2$) |
|---|---|---|---|---|---|
| 1 | 20:15:65 | 11954 | 1.88 | 72 | 40 |
| 2 | 20:10:70 | 12675 | 1.85 | 71 | 34 |
| 3 | 20:5:75 | 11527 | 1.90 | 72 | 20 |
| 4 | 15:15:70 | 11639 | 1.84 | 73 | 26 |
| 5 | 10:15:70 | 11438 | 1.87 | 74 | 24 |
| 6 | 10:30:60 | 12438 | 1.97 | 74 | 20 |

EXAMPLE 6

Preparation of terpolymer (DBMST-t-butyl methacrylate (BMA)-AST)

6.8 g (20 mmol) of DBMST, 5.7 g (40 mmol) of t-butyl methacrylate (BMA) and 18 g (140 mmol) of AST were dissolved in 140 ml of toluene. After adding 1.31 g of AIBN, the reaction product was separated through the same processes as in Example 2 (yield 75%).

The obtained reaction product was a terpolymer containing DBMST, BMA and AST monomers, having a weight average molecular weight of 11,748 and a polydispersity of 1.9. The result of FT-IR analysis of the DBMST-BMA-AST terpolymer is as follows.

FT-IR(KBr)(cm$^{-1}$): 2978 (C-H, t-butyl), 1766 (C=O, acetyl), 1726 (C=O), 1506, 1369 (C-H, t-butyl), 1214 (C-O), 1147.

EXAMPLE 7

Preparation of deacetylated terpolymer (DBMST-BMA-HST)

10 g of terpolymer obtained by Example 6 was deacetylated by the same method as in Example 3 (yield 90%).

A weight average molecular weight of the obtained reaction product was 10,658, a polydispersity was 2.0 and transmittance against ultraviolet rays was 74%/μm. The result of FT-IR analysis of the terpolymer DBMST-BMA-HST is as follows.

FT-IR(KBr)(cm$^{-1}$): 3402 (O-H), 2978 (C-H, t-butyl), 1702 (C=O), 1513, 1369 (C-H, t-butyl), 1231 (C-O), 1150.

EXAMPLE 8

Preparation of Photoresist Composition Using Terpolymer (DBMST-BST-HST), and Photolithographic Performance Using the Same 1.0 g of terpolymer (DBMST-BST-HST) obtained by Example 3 was dissolved in 6 g of propylene glycol monomethyl ether acetate, then 0.03 g of TPSOTf was added as a photosensitive acid generator. The mixture was stirred and then filtered through a filter having pores of 0.2 μm, resulting in a photoresist composition.

The obtained photoresist composition was spin-coated to a thickness of approximately 0.5 μm onto a wafer having a material layer to be patterned, and the wafer was then soft-baked at approximately 140° C. for about 90 seconds. After soft-bake, the photoresist was exposed using a mask defining a pattern with 0.40 μm line and space arrays and a stepper using a KrF eximer laser having a numerical aperture of 0.45. The wafer was then post-baked at approximately 140° C. for about 90 seconds. Finally, the photoresist was developed using 2.38 weight percent of tetramethylammonium hydroxide for 60 seconds to form a photoresist pattern. Then, the material layer underlying the patterned photoresist was etched using the resultant photoresist pattern.

A photoresist pattern having an excellent profile with 0.40 μm line and space arrays was formed using an exposure energy of 21 mJ/cm2, and a material layer pattern having an excellent profile was obtained using the photoresist pattern.

EXAMPLE 9

Preparation of Photoresist Composition Using Terpolymer (DBMST-BST-HST) Monomers and Photolithographic Performance Using the Same A photoresist composition was prepared by the same method as in Example 8, except that 2 mg of diethanolamine was further added as an organic base, and soft-baking was performed at 130° C.

A photoresist pattern having an excellent profile with 0.40 µm line and space arrays was formed using an exposure energy of 30 mJ/cm², and a material layer pattern having an excellent profile was obtained using the photoresist pattern.

EXAMPLE 10

Preparation of Photoresist Composition Using Terpolymer (DBMST-BA-HST), and Photolithographic Performance Using the Same A photoresist composition was prepared and applied to a wafer by the same method as in Example 8 using 1.0 g of terpolymer obtained by Example 5, containing DBMST, BA and HST monomers. Photolithography was then performed.

A photoresist pattern having an excellent profile with 0.40 µm line and space arrays was formed using an exposure energy of 20 mJ/cm², and a material layer pattern having an excellent profile was obtained using the photoresist pattern.

EXAMPLE 11

Preparation of Photoresist Composition Using Terpolymer (DBMST-BA-HST), and Photolithographic Performance Using the Same A photoresist composition was prepared by the same method as in Example 10, except that 2 mg of diethanolamine was further added as an organic base and soft-baking was performed at 130° C.

A photoresist pattern having an excellent profile with 0.40 µm line and space arrays was formed using an exposure energy of 34 mJ/cm², and a material layer pattern having an excellent profile was obtained using the photoresist pattern.

EXAMPLE 12

Preparation of Photoresist Composition Using Terpolymer (DBMST-BMA-HST), and Photolithographic Performance Using the Same A photoresist composition was prepared by the same method as in Example 8 using 1.0 g of terpolymer obtained by Example 5, containing DBMST, BMA and HST monomers, and photolithography was performed.

A photoresist pattern having an excellent profile with 0.40 µm line and space arrays was formed using an exposure energy of 24 mJ/cm², and a material layer pattern having an excellent profile was obtained using the photoresist pattern.

The polymers and photoresist compositions of the present invention have several advantages over conventional polymers and photoresists. They permit pre- and post-exposure baking at temperatures that harden the photoresist without causing it to decompose, and they have increased solubility and contrast which permit sharper line and space arrays to be obtained than can be obtained using conventional photoresists.

The acid-liable di-alkylmalonate group bound to the backbone of the polymers of the present invention functions as an effective dissolution inhibitor in the photoresist compositions. Acid hydrolysis of the bulky di-alkylmalonate group into malonic acid during exposure to light considerably increases the solubility of the photoresist composition. The solubility difference before and after exposure, produces a contrast that is significantly higher than the contrast obtained using conventional photoresist compositions having a t-butoxycarbonyl (t-BOC) group as the acid-labile group.

Another advantage of the photoresist compositions of the present invention is that the photosensitive di-alkylmalonate-containing acid-labile dissolution inhibitor and the photosensitive acid generator are both thermally stable. The polymers therefore cause the photoresist compositions of the present invention to have a thermal decomposition temperature that is higher than the glass transition temperature of approximately 130° C. Thus the photoresists can be hardened by pre-baking without decomposing the photoresist. This hardening prevents contaminants from absorbing to the photoresist layer where they interfere with the photosensitive acid generator and cause defective patterns. The photoresist compositions of the present invention can be pre-baked at a high enough temperature to prevent adsorption of contaminants that result in defective patterns such as T-top profiles.

The present invention is not limited to the embodiments set forth above, and it is clearly understood that many variations may be made within the scope of the present invention by anyone of skill in the art.

What is claimed is:

1. A polymer for use in a chemically amplified photoresist comprising, a polymer polymerized with three or more different monomers, and having an acid-labile di-alkylmalonate group bound to the backbone of the polymer.

2. The polymer of claim 1, wherein the di-alkylmalonate group is di-t-butylmalonate or di-tetrahydropyranylmalonate.

3. The polymer of claim 1, wherein the polymer has a weight average molecular weight ranging from 5,000 to 100,000.

4. The polymer of claim 1, wherein:

the polymer has the chemical formula (CF1):

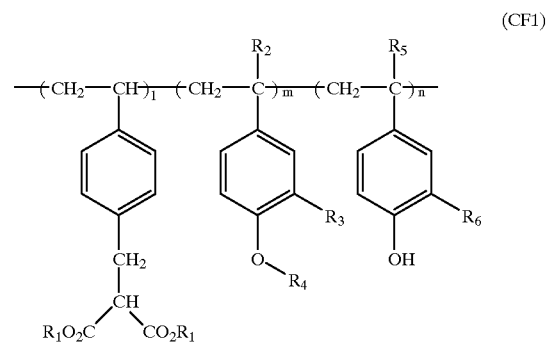

wherein R1 is t-butyl or tetrahydropyranyl,

R4 is methyl or t-butyl,

R2, R3, R5 and R6 are hydrogen or methyl, l, m and n are integers, the ratio of l (l+m+n) is from about 0.01 to about 0.5, the ratio of m/(l+m+n) is from about 0.01 to about 0.5, and the ratio of l+m/(l+m+n) is from about 0.1 to about 0.5; and the polymer has a weight average molecular weight ranging from 5,000 to 100,000.

5. The polymer of claim 1, wherein:

the polymer has the chemical formula (CF2):

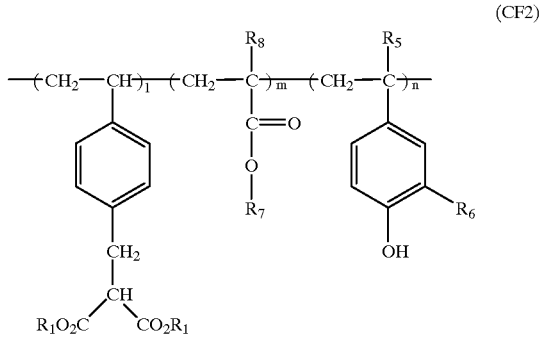

(CF2)

wherein R1 and R7 are t-butyl or tetrahydropyranyl,
R5, R6 and R8 are hydrogen or methyl,
l, m and n are integers,
the ratio of l (l+m+n) is from about 0.01 to about 0.5,
the ratio of m/(l+m+n) is from about 0.01 to about 0.5, and
the ratio of l+m/(l+m+n) is from about 0.1 to about 0.5; and
the polymer has a weight average molecular weight ranging from 5,000 to 100,000.

6. A photoresist composition comprising:
a polymer polymerized with three or more different monomers and having an acid-labile di-alkylmalonate group bound to the backbone of the polymer; and
a photosensitive acid generator.

7. The photoresist composition of claim 6, wherein the photoresist composition further comprises an organic base in an amount of from about 0.01 to about 2.0 weight percent based on the weight of the polymer.

8. The photoresist composition of claim 7, wherein the organic base is triethylamine, triisobutylamine, diethanolamine or triethanolamine.

9. The photoresist composition of claim 6, wherein the photosensitive acid generator is triarylsulfonium salts, diaryliodonium salts or sulfonates.

10. The photoresist composition of claim 6, wherein the di-alkylmalonate group is di-t-butylmalonate or di-tetrahydropyranylmalonate.

11. The photoresist composition of claim 6, wherein:
the polymer has the chemical formula (CF1):

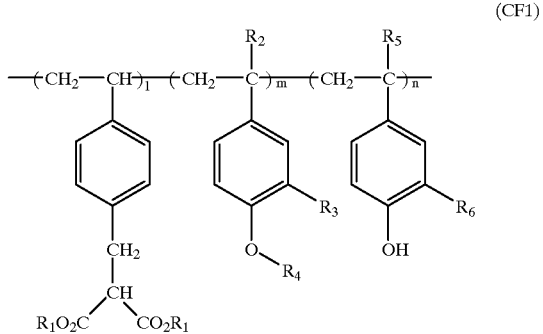

(CF1)

wherein R1 is t-butyl or tetrahydropyranyl,
R4 is methyl or t-butyl,
R2, R3, R5 and R6 are hydrogen or methyl,
l, m and n are integers,
the ratio of l (l+m+n) is from about 0.01 to about 0.5,
the ratio of m/(l+m+n) is from about 0.01 to about 0.5, and the ratio of l+m/(l+m+n) is from about 0.1 to about 0.5; and
the ratio of l+m/(l+m+n) is from about 0.1 to about 0.5;
the polymer has a weight average molecular weight ranging from 5,000 to 100,000; and
the photosensitive acid generator is in an amount of from about 1 to about 15 weight percent based on the weight of the polymer.

12. The photoresist composition of claim 11, wherein R1 and R4 are t-butyl; and R2, R3, R5 and R6 are hydrogen.

13. The photoresist composition of claim 6, wherein:
the polymer has the chemical formula (CF2):

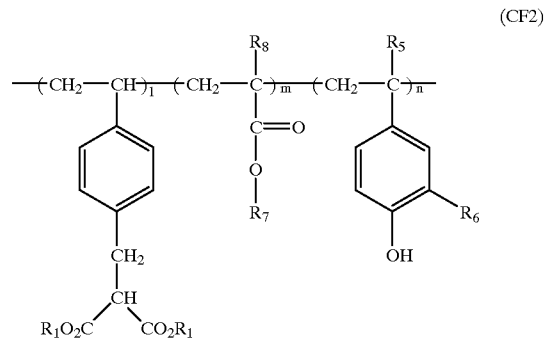

(CF2)

wherein R1 and R7 are t-butyl or tetrahydropyranyl,
R5, R6 and R8 are hydrogen or methyl,
l, m and n are integers,
the ratio of l (l+m+n) is from about 0.01 to about 0.5,
the ratio of m/(l+m+n) is from about 0.01 to about 0.5, and
the ratio of l+m/(l+m+n) is from about 0.1 to about 0.5; and
the polymer has a weight average molecular weight ranging from 5,000 to 100,000; and
the photosensitive acid generator is in an amount of from about 1 to about 15 weight percent based on the weight of the polymer.

14. The photoresist composition of claim 13, wherein R1 and R7 are t-butyl; and R5, R6 and R8 are hydrogen.

15. A method of preparing a polymer for use in a chemically amplified photoresist, comprising:
polymerizing di-alkylmalonylmethylstyrene, alkoxystyrene or alkoxystyrene derivative, and acetoxystyrene or acetoxystyrene derivative to obtain a terpolymer having three or more different monomers; and
deacetylating the terpolymer obtained through the polymerization, using an organic base.

16. The method of claim 15, wherein the organic base is selected from the group comprising ammonium hydroxide and hydrazine.

17. A method of preparing a polymer for use in a chemically amplified photoresist, comprising:
polymerizing di-alkylmalonylmethylstyrene, (meth) acrylate derivative, and acetoxystyrene or acetoxystyrene derivative to obtain a terpolymer having three or more different monomers; and
deacetylating the terpolymer obtained through the polymerization, using an organic base.

18. The method of claim 17, wherein the organic base is ammonium hydroxide or hydrazine.

* * * * *